(12) United States Patent
Hu et al.

(10) Patent No.: US 8,637,402 B2
(45) Date of Patent: Jan. 28, 2014

(54) CONDUCTIVE LINE STRUCTURE AND THE METHOD OF FORMING THE SAME

(75) Inventors: Yu-Shan Hu, Yangmei Township, Tauyuan County (TW); Ming-Chih Chen, Hsinchu (TW); Dyi-Chung Hu, Chutung (TW)

(73) Assignee: ADL Engineering Inc., Hsinchu County (TW)

( * ) Notice: Subject to any disclaimer, the term of this patent is extended or adjusted under 35 U.S.C. 154(b) by 201 days.

(21) Appl. No.: 13/311,287

(22) Filed: Dec. 5, 2011

(65) Prior Publication Data

US 2012/0077340 A1      Mar. 29, 2012

Related U.S. Application Data

(62) Division of application No. 12/009,188, filed on Jan. 17, 2008, now abandoned.

(51) Int. Cl.
*H01L 21/44* (2006.01)

(52) U.S. Cl.
USPC .......................................................... 438/686

(58) Field of Classification Search
USPC ......... 438/673, 678, 687, 697, 617, 686, 689, 438/694, 656, 622, 118
See application file for complete search history.

(56) References Cited

U.S. PATENT DOCUMENTS 5,242,861 A * 9/1993 Inaba ............................ 438/627
7,102,231 B2   9/2006 Yamazaki et al.

* cited by examiner

*Primary Examiner* — Hoa B Trinh
(74) *Attorney, Agent, or Firm* — Muncy, Geissler, Olds & Lowe, PLLC

(57) ABSTRACT

The conductive line structure of a semiconductor device including a base; at least one patterned conductive layer formed over the base; a conductive line formed over the at least one patterned conductive layer; a protection layer that encompasses the top surface and sidewall of the conductive line to prevent undercut generated by etching. The structure further comprises an underlying layer under the conductive line. The underlying layer includes Ni, Cu or Pt. The conductive line includes gold or copper. The at least one patterned conductive layer includes at least Ti/Cu. The protection layer includes electro-less plating Sn, Au, Ag or Ni.

11 Claims, 6 Drawing Sheets

CONDUCTIVE LINE STRUCTURE AND THE METHOD OF FORMING THE SAME

CROSS REFERENCE TO RELATED APPLICATIONS

This application is a Divisional of Application Ser. No. 12/009,188, filed on 17 Jan. 2008, now abandoned and for which priority is claimed under 35 U.S.C. §120, the entire contents of which is hereby incorporated by reference.

FIELD OF THE INVENTION

This invention relates to a structure of conductive line, and more particularly to a conductive line with protection scheme and the method of forming the same.

BACKGROUND OF THE INVENTION

Description Of The Prior Art

Typically in the electronic component world, integrated circuits (ICs) are fabricated on a semiconductor substrate, known as a chip, and most commonly are made of silicon. The silicon chip is typically assembled into a larger package which serves to provide effective enlargement of the distance or pitch between input/output contacts of the silicon making it suitable for attachment to a printed circuit board, and to protect the IC from mechanical and environmental damage. With the trend moving to more and more features packed into decreasing product envelopes, utilizing ever smaller electronic components to improve upon size and feature densification a constant and formidable challenge is presented to manufacturers of consumer and related articles. Chip scale packages (CSP) were developed to provide an alternative solution to directly attached flip chips devices. These packages (CSP) represent a new miniature type of semiconductor packaging used to address the issues of size, weight, and performance in electronic products, especially those for consumer products such as mobile telephones, pagers, portable computers, video cameras, etc. Standards have not yet been formalized for CSP, and as a result, many variations exist, and several of which are described in "Chip Scale Package," cited above. In general, the chip is the dominant constituent of a CSP with the area of the package, being no more than 20% greater than the area of the chip itself, but the package has supporting features which make it more robust than direct attachment of a flip chip.

A conductive film or wiring are widely used during the manufacture of the above mentioned semiconductor chips. The wiring is obtained after a conductive film is subjected to patterning processes. If wiring material Cu diffuses into an interlayer insulating film, the wiring material Cu has a harmful influence on electric characteristics. A barrier layer is provided in order to prevent penetration of Cu into an undesired area. A compound obtained by doping nitride of a high-melting point metal with silicon or boron are being examined as the material of the diffusion preventing film. Examples thereof include Ta, TaN, TaSiN, TiN, TiSiN, W, WN, WSiN, and WBN. On the diffusion preventing film, a thin copper seed layer is formed by directional sputtering. The copper seed layer receives copper plating by electroplating, which is advantageous when the aspect ratio is high. Typically, the barrier layer is formed of a film containing nitrogen, such as tantalum nitride (TaN), titanium nitride (TiN), tungsten nitride (WN).

One of the prior art structures is described in U.S. Pat. No. 7,102,231, in which a conventional barrier structure is provided and the structure contains Ti, a conductive barrier film containing TiN, and Cu wiring, which are laminated in order from a substrate side, and an insulating barrier film containing SiN is provided for covering the Cu wiring. In this case, patterning is performed to the conductive film containing Ti and the conductive barrier film containing TiN at the same time, the Cu wiring is formed, and the insulating barrier film containing SiN is thereafter formed. A second embodiment can be found in FIG. 11B of the patent, wherein it discloses a structure in which a conductive barrier film containing TiN and an insulating barrier film containing SiN are provided and conductive films of the wiring are laminated. In comparison with the above case, Al is provided between the Ti and TiN. A further case is also shown in FIG. 11C of this patent, wherein the TiN is replaced by the TaN, and the laminate structure is constructed as Ti/TaN/Cu/SiN from the substrate side. A wiring structure shown in FIG. 11D has a structure in which a conductive barrier film containing WN and an insulating barrier film containing SiNO are provided. In the case, TiN is replaced by WN and the SiN is also changed to SiNO.

In order to improve the speed of the device operation, some suggestions to achieve the purpose are the usage of the gold or copper to act as the wiring material. Typically, the copper is formed by electroplating method. One drawback of the electroplating is observed, wherein undercut may be generated after the etching processes, seriously, as shown in FIG. 3. A further consideration is that the cycle time is too long and consequently, the throughput is degraded seriously.

In view of the aforementioned drawbacks, what is required is an improved method to overcome the undercut issue and increase the cycle time for the wiring formation.

SUMMARY OF THE INVENTION

In view of the drawbacks of prior art, the present invention provides a new wiring formation method and structure to solve the undercut issue and improve cycle time.

One aspect of the present invention is to form the wiring structure by means of chemical reaction to replace the electroplating gold, thereby removing the electroplating process, and the chemical Sn is formed by an immersion step, only to protect the wiring. The dimension and line width is controllable and the sidewall of the wiring will not be eroded by the etching solution.

According to the above-mentioned purpose, there is thus a need for a new wiring (conductive line) structure to promote device reliability and enhance the performance of the device.

The conductive line structure of a semiconductor device comprises a base; at least one patterned conductive layer formed over the base; a conductive line formed over the at least one patterned conductive layer; and a protection layer that encompasses the top surface and sidewall of the conductive line to prevent the undercut issue generated by etching.

The structure further comprises an underlying layer under the conductive line. The underlying layer includes Ni, Au or Pt. The conductive line includes gold or copper. The at least one patterned conductive layer includes at least Ti/Cu. The protection layer includes electro-less plating Sn, Au, Ag or Ni.

Another aspect of the present invention is a method of forming a conductive line structure of a semiconductor device, comprising the steps of: providing a base; forming at least one conductive layer over the base; followed by patterning a photo-resist pattern over the at least one conductive layer to expose a top layer of the at least one conductive layer;

and then etching the top layer. Subsequently, an underlying layer is formed over the etched at least one conductive layer, and then forming a conductive line over the underlying layer. Thereafter, the photo-resist pattern is stripped. Next, a protection layer is formed to encompass the top surface and sidewall of the conductive line to prevent the undercut issue generated by etching. The conductive line is formed by electro-plating. The at least one patterned conductive layer is formed by sputter.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENT

The present invention discloses an under bump metallurgy structure of a package and method of the same. It can apply to a wafer level package. Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims.

Figure 1:
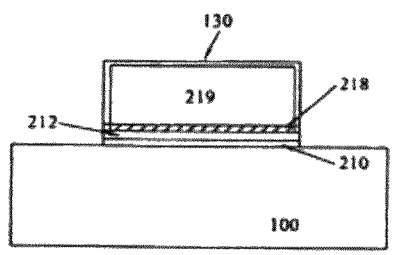
FIG. 1 is a schematic diagram of a conductive line structure according to the present invention.

Referring to FIG. 1, the wiring (conductive line) structure includes at least one patterned metal layer 210, 212, 214, formed on a base 100 (substrate or layer). An underlying layer 218 is then formed on the multiple layers. A conductive line 219 is subsequently formed on the underlying layer 218. A protection layer 130 encompasses the top surface and the sidewall of the conductive line. In one embodiment, the base 100 is semiconductor substrate or any underlying layer formed of isolation material. The material of metal layers 210, 212, 214 comprises Ti, Cu. The underlying layer 218 includes Ni, Au, Pt. One aspect of the present invention is that the protection layer comprise Sn, Au, Ag or Ni and is formed by an electro-less-plating process.

Figure 2A:
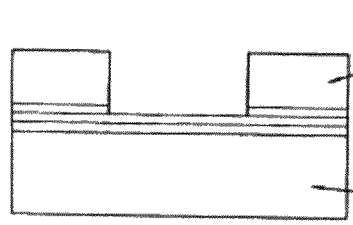
FIG. 2A-2E is the process flow according to the present invention.

One example process of forming the FIG.1 structure is shown in FIG. 2A. A semiconductor substrate 100 is provided. Multi-metal layers 210, 212, 214 are subsequently formed over the substrate 100. In one embodiment, the multi-metal layers are constructed by sandwich structure Ti/Cu/Ti 210, 212, 214. Electroplating is one of the choices to form the multi-metal layers 210, 212, 214. Preferably, the multi-metal layers 210, 212, 214 are formed by a sputter technique. Subsequently, photoresist (PR) 216 is formed over the multi-metal layers 210, 212, 214, followed by patterning the PR 216 by a lithography process to obtain the pre-determined pattern.

Figure 2B:
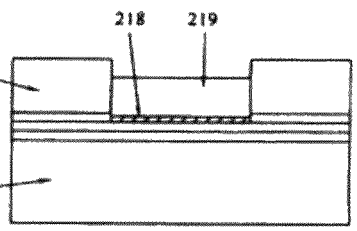
Figure 2C:
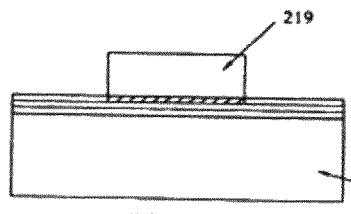

The upper Ti 214 that is exposed by the PR 216 is then etched to expose the Cu 212, followed by to form the conductive line 219 through Ni/Cu plating or Au/Cu plating to form the bi-layers structure having layer 218 and 219, as shown in FIG. 2B. The PR 216 is next stripped as shown in FIG. 2C to expose the remaining upper Ti 214.

Figure 2D:
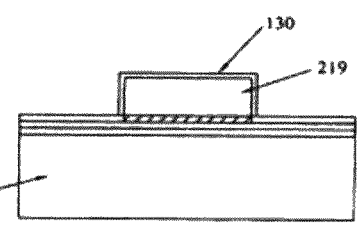
Figure 2E:
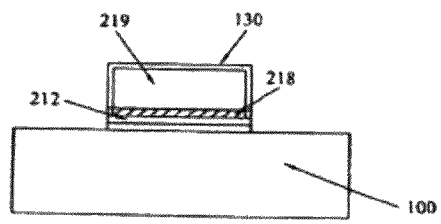
Figure 3:
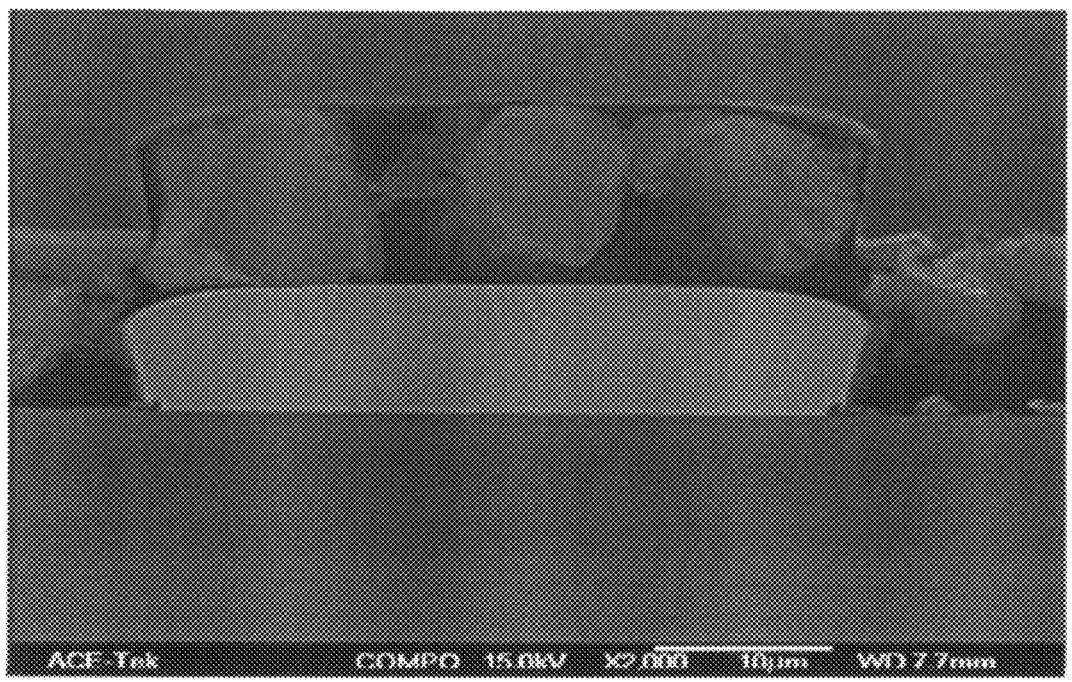
FIG. 3 is an SEM diagram showing the undercut issue of the prior art.

The protection layer 130 is then formed to encompass the top surface and the sidewall of the conductive line including 218 and 219. Alternatively, the layer 218 could be Ni, Au, Pt. In one embodiment, the protection layer 130 comprise Sn, Au, Ag or Ni and is formed free of an electro-plating process. In one example, the substrate is immersed into the chemical solution containing the above material, such as Sn. The chemical solution will be reactive with the Cu and thereby form the protection layer. From above, the present invention is an e-plating free process (or electro-less plating), as shown in FIG. 2D. Next, referring to FIG. 2E, the Ti/Cu/Ti exposed by the wiring structure with protection layer is stripped by wet etching by means of $Cu(NH_3)_4Cl_2$ or hyposulfite of soda $Na_2S_2O_3$ solution.

Figure 4:
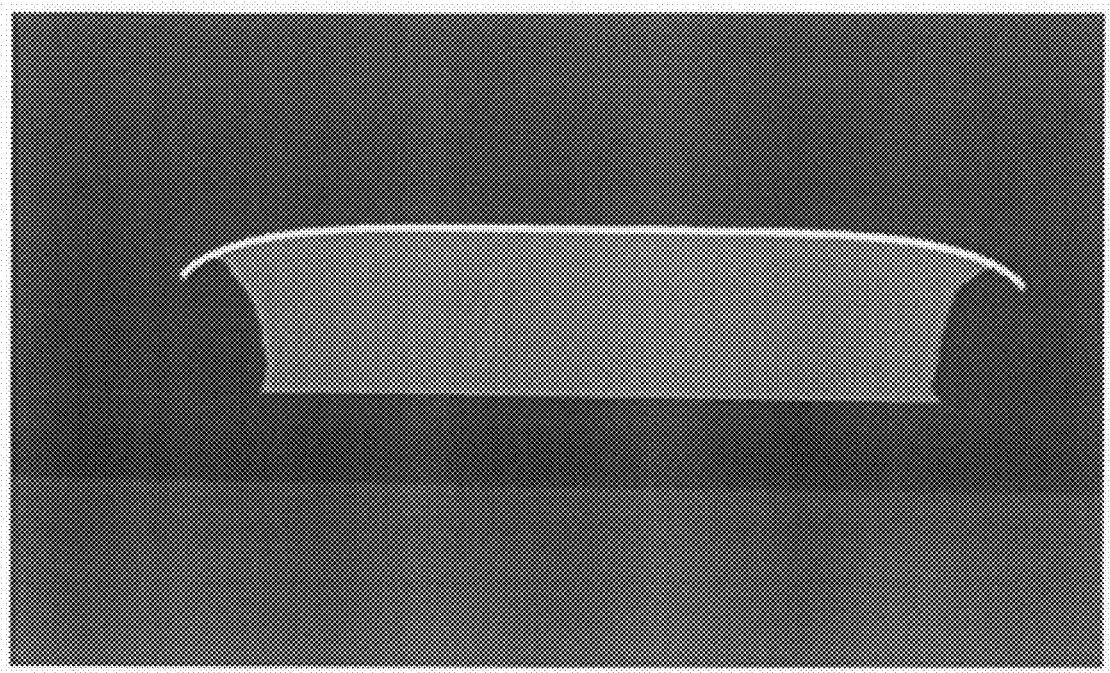
FIG. 4 is an SEM diagram showing the gold wire of the prior art.
Figure 4A:
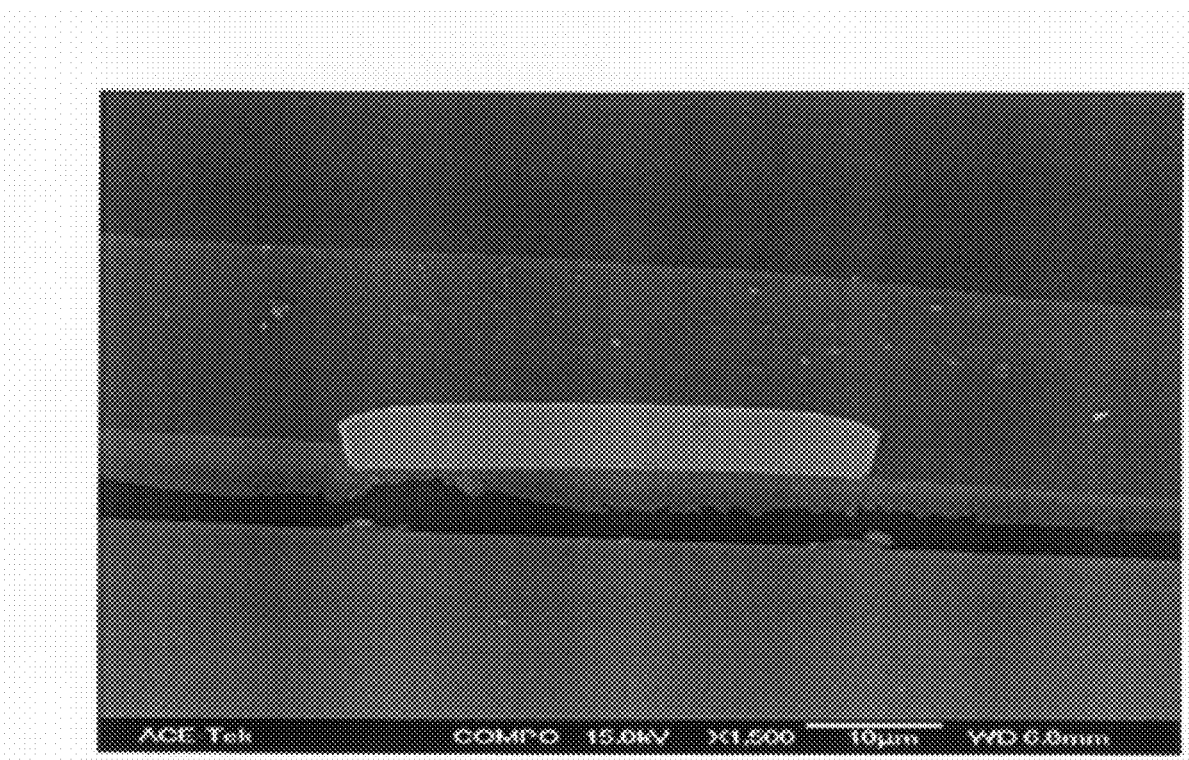
FIG. 4A is an SEM diagram illustrating the structure, without gold wire and undercut, of the present invention.
Figure 5:
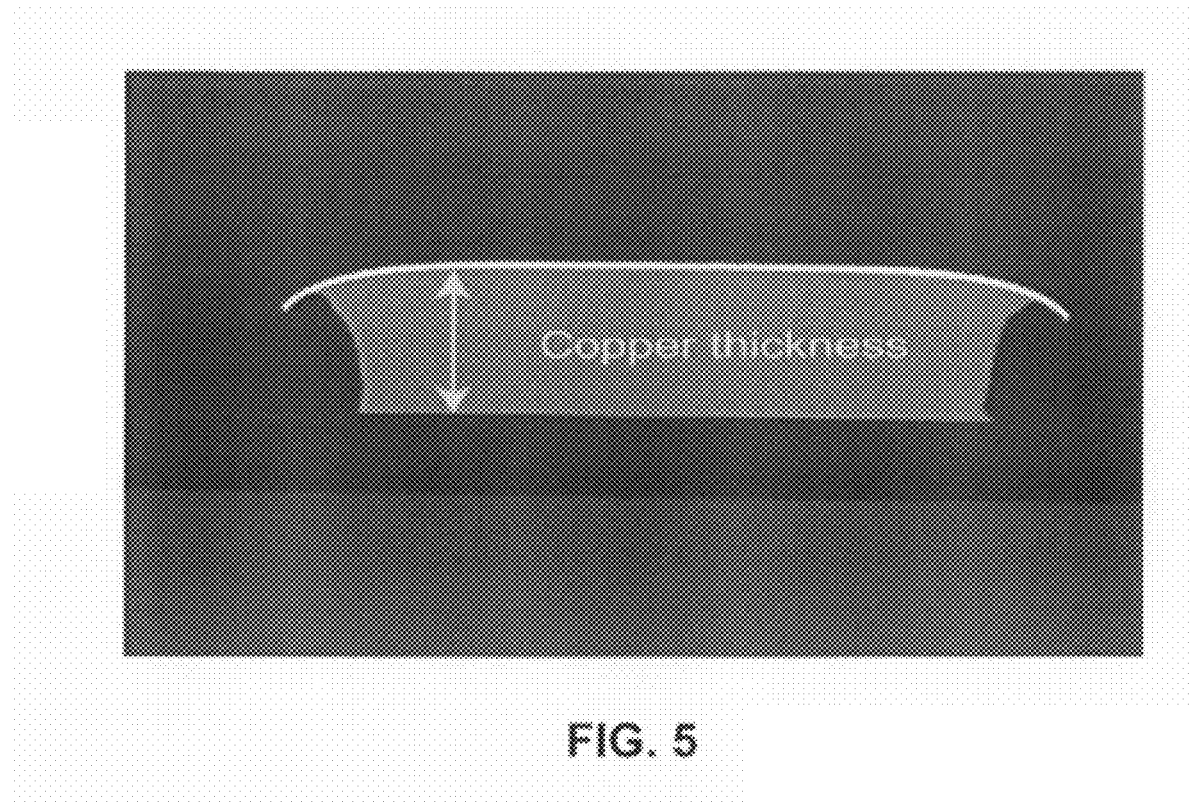
FIG. 5 is an SEM diagram illustrating the purpose thickness control of the present invention.
Figure 6:
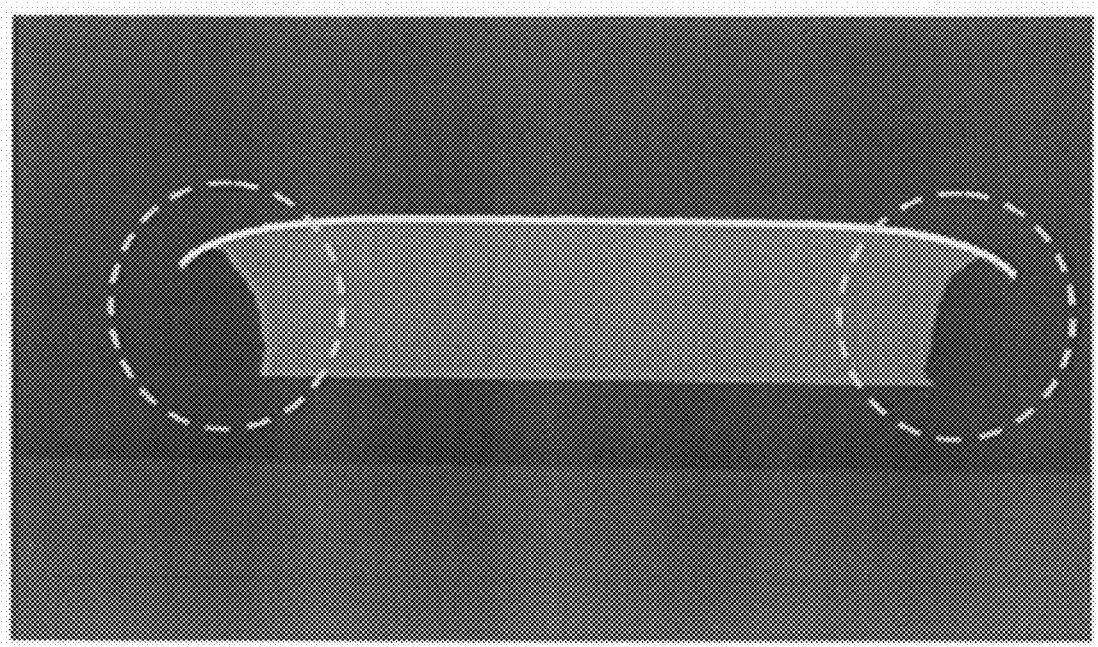
FIG. 6 is an SEM diagram illustrating the purpose sidewall control of the present invention.

The present invention may control the thickness of the copper. The thickness of the wiring is controllable by the plating. Referring to FIG. 5, it indicates the prior thickness can be controlled by the present invention. The sidewall erosion issue of the prior art can be also eliminated by the protection layer. Please refer to FIGS. 5 and 6. FIG. 4A shows the structure without gold wire and undercut according to the present invention.

The present invention has the following advantages: high reliability, avoiding the tin infiltration, the wiring structure is formed by means of chemical electro-free plating to replace the electroplating, thereby removing the electroplating process, and the electro-free plating Sn is formed by an immersion step to protect the wiring. The dimension and line width is controllable and the sidewall of the wiring will not be eroded by the etching solution.

If the protection layer is Au or Ag high conductivity , it is suitable for a high frequency RF product. The cost reduction is due to the employment of electro-free plating. The process is compatible with the current facility, and no additional equipment is needed. The process may be widely used for the semiconductor industry and assembly to meet future demands.

As described herein, various methods and structures have been provided which make advantageous use of an electroless process to create wiring of various shapes and dimensions. Various structures that can be made through the use of these methods have also been provided. The methods disclosed herein can be used to create conductive lines that are found to improve some of the characteristics. These various features, taken alone or in combination, are found to have profound, beneficial effects on package reliability and lifetime.

The above description of the invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

The invention claimed is:
1. A method of forming conductive line structure of semiconductor device, comprising:
providing a base;
forming at least one conductive layer over said base;

patterning a photo-resist pattern over said at least one conductive layer to expose a top layer of said at least one conductive layer;
etching said top layer of said at least one conductive layer;
forming an underlying layer over said etched at least one conductive layer;
forming a conductive line over said underlying layer;
stripping said photo-resist pattern;
forming a protection layer to encompass the top surface and sidewall of said conductive line to prevent undercut generated by etching.

2. The method of claim 1, wherein said underlying layer includes Ni, Au or Pt.

3. The method of claim 1, wherein said conductive line includes gold.

4. The method of claim 1, wherein said conductive line includes copper.

5. The method of claim 1, wherein said conductive line is formed by electro-plating.

6. The method of claim 1, wherein said at least one patterned conductive layer includes Ti/Cu/Ti.

7. The method of claim 2, wherein said at least one patterned conductive layer is formed by sputter.

8. The method of claim 1, wherein said protection layer is formed by electro-less plating Sn.

9. The method of claim 1, wherein said protection layer is formed by electro-less plating Au.

10. The method of claim 1, wherein said protection layer is formed by electro-less plating Ag.

11. The method of claim 1, wherein said protection layer is formed by electro-less plating Ni.

* * * * *